(12) United States Patent
Tonomoto et al.

(10) Patent No.: US 11,563,384 B2
(45) Date of Patent: Jan. 24, 2023

(54) CAPACITOR DEVICE

(71) Applicant: DENSO CORPORATION, Kariya (JP)

(72) Inventors: Masaya Tonomoto, Kariya (JP);
Tetsuya Matsuoka, Kariya (JP);
Hiromi Ichijo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/170,978

(22) Filed: Feb. 9, 2021

(65) Prior Publication Data

US 2021/0167694 A1 Jun. 3, 2021

Related U.S. Application Data

(63) Continuation of application No. PCT/JP2019/031217, filed on Aug. 7, 2019.

(30) Foreign Application Priority Data

Aug. 10, 2018 (JP) ................................ 2018-151645
Jul. 12, 2019 (JP) ............................. JP2019-129723

(51) Int. Cl.
*H05K 5/02* (2006.01)
*H02M 7/00* (2006.01)
*H05K 7/14* (2006.01)

(52) U.S. Cl.
CPC .......... *H02M 7/003* (2013.01); *H05K 5/0217* (2013.01); *H05K 7/1401* (2013.01)

(58) Field of Classification Search
CPC ... H02M 7/003; H05K 5/0217; H05K 7/1401; H05K 7/1432
See application file for complete search history.

(56) References Cited

U.S. PATENT DOCUMENTS

| 2014/0140034 A1 | 5/2014 | Kusada et al. |
| 2014/0285969 A1 | 9/2014 | Kojima et al. |
| 2021/0013769 A1* | 1/2021 | Kobayashi ............... H01R 4/30 |

FOREIGN PATENT DOCUMENTS

| JP | 2014-020742 A | 2/2014 |
| JP | 2014-068449 A | 4/2014 |
| JP | 2017-085816 A | 5/2017 |
| JP | 2018-078247 A | 5/2018 |
| WO | 2015/052984 A1 | 4/2015 |

OTHER PUBLICATIONS

Sep. 24, 2019 International Search Report issued in International Patent Application No. PCT/JP2019/031217.

* cited by examiner

*Primary Examiner* — James Wu
*Assistant Examiner* — Hung Q Dang
(74) *Attorney, Agent, or Firm* — Oliff PLC

(57) ABSTRACT

In a power converter, electronic components constituting a power conversion circuit is provided. A capacitor module and a converter case are also provided in the power converter. Fastening members, which include a first fastening member and a second fastening member, are configured to fasten the capacitor module to the converter case. The first and second fastening members are mounted on the inner bottom surface of the converter case. At least one of the electronic components is mounted to the capacitor module and is arranged between the first fastening member and the second fastening member when viewed in a view direction perpendicular to an alignment direction of the first and second fastening members. The view direction is parallel to the inner bottom surface of the converter case.

11 Claims, 10 Drawing Sheets

CAPACITOR DEVICE

CROSS-REFERENCE TO RELATED APPLICATION

This application is a bypass continuation application of currently pending international application No. PCT/JP2019/31217 filed on Aug. 7, 2019 designating the United States of America, the entire disclosure of which is incorporated herein by reference.

This application is based on and claims the benefit of priority from earlier Japanese Patent Application No. 2018-151645 filed on Aug. 10, 2018 and Japanese Patent Application No. 2019-129723 filed on Jul. 12, 2019, the description of each of which is incorporated herein by reference.

TECHNICAL FIELD

The present invention relates to power converters.

BACKGROUND

Power converters, each of which is comprised of plural electronic components constituting a power conversion circuit, are used for various purposes.

SUMMARY

According to an aspect of the present disclosure, there is provided a power converter. In the power converter, at least one of electronic components is mounted to a capacitor module and is arranged between a first fastening member and a second fastening member when viewed in a view direction perpendicular to an alignment direction of the first and second fastening members; the view direction is parallel to the inner bottom surface of the converter case.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENTS

Figure 1:
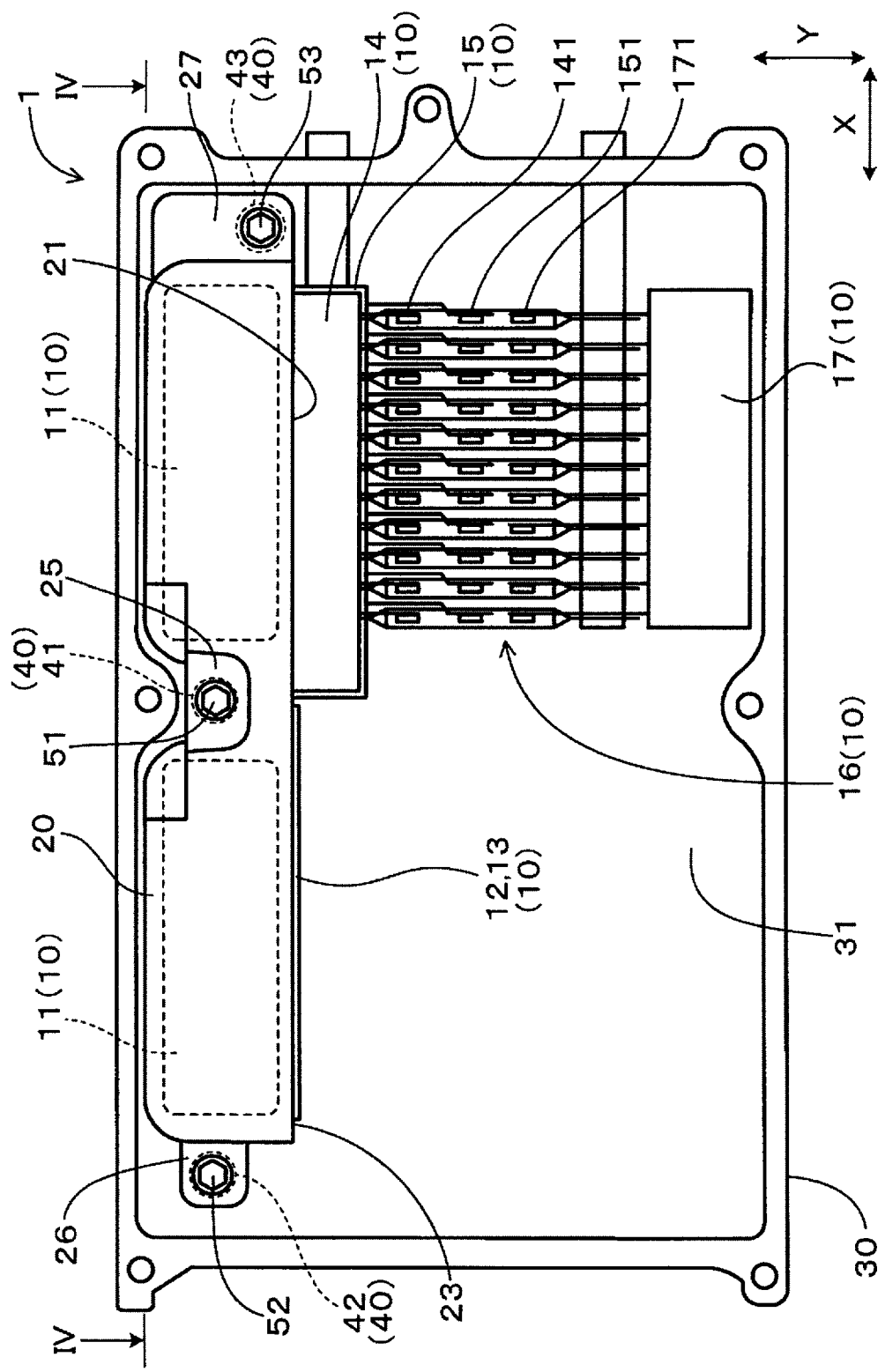
FIG. 1 is a schematic top view of a power converter according to the first embodiment of the present disclosure.

Japanese Patent Application Publication No. 2014-207427 discloses, as an electronic component used for a power converter, a capacitor module. The capacitor module disclosed in the patent publication includes capacitors (capacitor elements) incorporated therein, and includes other electronic components, such as busbars and discharge resistors, mounted thereto. Such a power converter is comprised of a case, and the capacitor module and the other electronic components, which constitute the power conversion circuit, are fixedly disposed in the case.

As described above, the capacitor module disclosed in the patent publication is comprised of heat-producing electronic components, such as the capacitors, busbars, and discharge resistors. Unfortunately, because the capacitor case includes a fixture portion, which is to be fixed to the case of the power converter, provided at one end thereof, heat generated from the capacitor module may not be sufficiently dissipated from the capacitor module to the power-converter's case. This may cause the capacitor module to have poor heat dissipation, resulting in a possibility of an excessive increase in temperature of the capacitors.

From the above viewpoint, the present disclosure seeks to provide power converters, each of which includes a capacitor module with more improved heat dissipation.

According to an exemplary aspect of the present disclosure, there is provided a power converter. The power converter includes a plurality of electronic components constituting a power conversion circuit, a capacitor module including a capacitor that constitutes the power conversion circuit, and a converter case having an inner bottom surface and housing the electronic components and the capacitor module.

The power converter includes fastening members that include a first fastening member and a second fastening member and that are configured to fasten the capacitor module to the converter case. The first and second fastening members are mounted on the inner bottom surface of the converter case. At least one of the electronic components is mounted to the capacitor module and is arranged between the first fastening member and the second fastening member when viewed in a view direction perpendicular to an alignment direction of the first and second fastening members; the view direction is parallel to the inner bottom surface of the converter case.

The power converter set forth above is configured such that the at least one of the electronic components is mounted to the capacitor module and is arranged between the first fastening member and the second fastening member. This configuration enables heat generated from the at least one of the electronic components to be more easily transferred to the converter case through the first and second fastening members, making it possible to improve the heat dissipation of the capacitor module.

The present disclosure therefore provides the power converter with the capacitor module having more improved heat dissipation.

Note that each parenthesized reference numeral of a corresponding component shown in claims represents a correspondence relationship with reference to a corresponding component described in the following embodiments, but do not limit the corresponding component to the disclosure of the following embodiments.

The following describes a power converter 1 according to the first embodiment with reference to FIGS. 1 to 6.

Referring to FIG. 1, the power converter 1 of the present embodiment includes a plurality of electronic components 10, a capacitor case 20, a capacitor module 2, and a converter case 30.

The electronic components 10 constitute a power conversion circuit.

The capacitor module 2 includes capacitors 11 that also belong to the electronic components 10.

The converter case 30 is configured to house the electronic components 10 and the capacitor module 2 therein.

The power converter 10 includes fastening members 40 that fasten the capacitor module 2 to the converter case 30. The converter case 30 has an inner bottom surface 31. The fastening members 40 include a first fastening member 41 and a second fastening member 42 mounted vertically on the inner bottom surface 31 of the converter case 30, and the first and second fastening members 41 and 42 fasten the capacitor module 2 to the converter case 30.

The first fastening member 41 is located to be aligned with the second fastening member 42. At least one of the electronic components 10 except for the capacitors 11 is mounted to the capacitor module 2. The at least one of the electronic members 10 except for the capacitors 11 is also arranged between the first and second fastening members 41 and 42 when viewed in a view direction perpendicular to the alignment direction of the first and second fastening members 41 and 42; the view direction is parallel to the inner bottom surface 31 of the converter case 30.

The following describes in detail the power converter 1 according to the present embodiment.

The electronic components 10 illustrated in FIG. 1 constitute the power conversion circuit that serves as, for example, an inverter and/or a converter. The electronic components 10 include, in addition to the capacitors 11, a discharge resistor 12, a discharge circuit board 13, a P busbar (capacitor P busbar) 14, an N busbar (a capacitor N busbar) 15, a semiconductor module 16, and a terminal holder 17; these components constitute other electronic components.

The capacitors 11 are arranged to be aligned with each other.

The Present Embodiment Defines

1. The alignment direction of the capacitors 11 as an X direction

2. A direction in which an opening first face 23 of the capacitor case 23 and a second face opposite to the opening first face 23 as a Y direction, i.e. a thickness direction 3. A direction, i.e. a height direction, which is perpendicular to both the X and Y directions Referring to FIG. 5, the present embodiment uses two capacitors 11 that are incorporated in the capacitor case 20. The capacitor module 2 includes a sealing resin 22 filled in the capacitor case 20 to encapsulate the capacitors 11 therein, resulting in the capacitor module 2 being formed.

The capacitor case 20 of the present embodiment is made of resin, and has a substantially rectangular-parallelepiped shape. The capacitor case 20 has an elongated shape in the alignment direction of the capacitors 11, i.e. in the X direction.

The capacitor case 20 has a first side face 23 that defines an opening, resulting in the first side face 23 serving as the opening first face 23. A part of the sealing resin 22 filled in the capacitor case 20, which is exposed through the opening first face 23, serves as a potting surface, resulting in the exposed potting surface of the sealing resin 22 constituting a first side face 21 of the capacitor module 2.

To the first side face 21 of the capacitor module 2, the discharge resistor 12, the discharge circuit board 13, the P busbar 14, and the N busbar 15 are mounted. The discharge circuit board 13 can include a circuit comprised of unillustrated switches.

The capacitor module 3 according to the present embodiment has a substantially rectangular-parallelepiped shape, but can have another shape, such as a solid shape with a trapezoidal shape when viewed from side.

Figure 5:
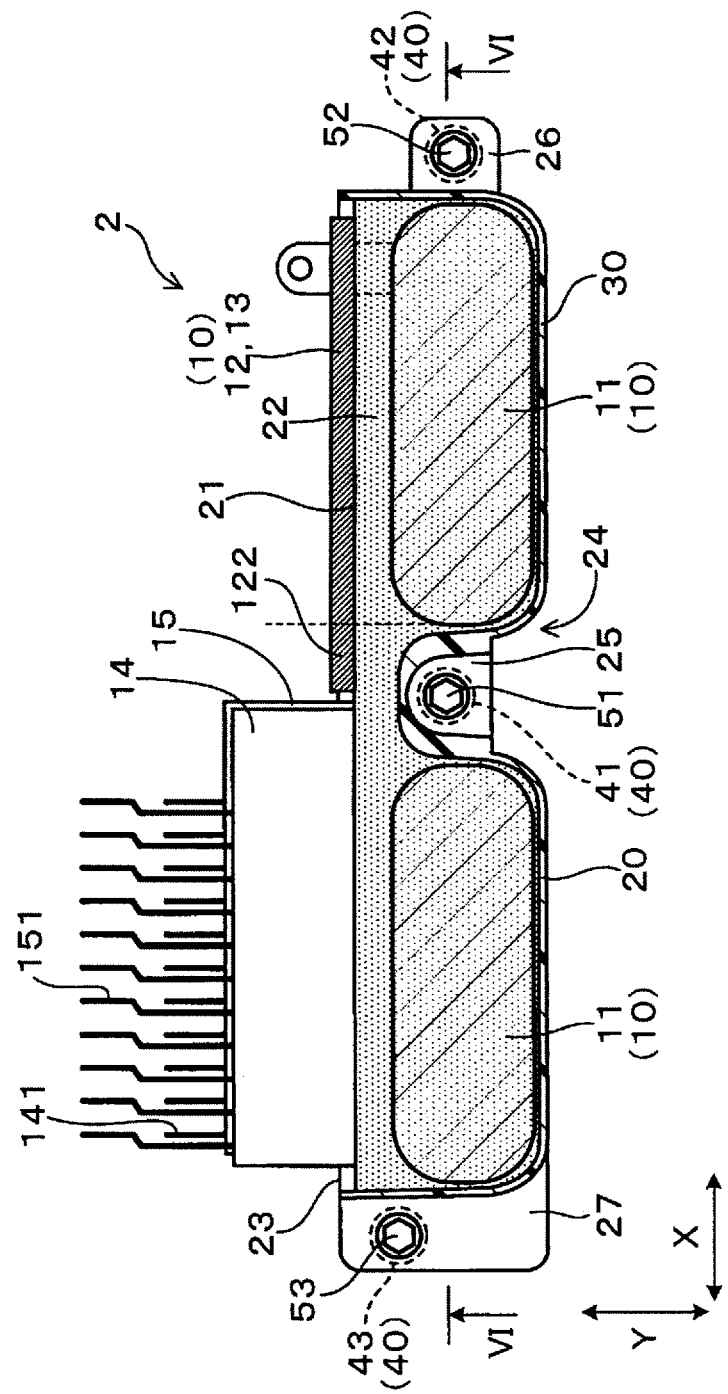
FIG. 5 is a cross-sectional view taken along line V-V of FIG. 4.

Referring to FIG. 5, the capacitor case 20 has the second face opposite to the opening first face 23, and has a concaved recess 24 formed in the second face. The capacitor case 20 includes a first catch member 25 formed in the concaved recess 24. The first catch member 25 is configured to be fastened to the first fastening member 41. The concaved recess 24 is located between the two capacitors 11. The first catch member 25 has a through hole formed therethrough, and is fastened to the first fastening member 41 with a bolt 51 fitted through the through hole.

Figure 6:
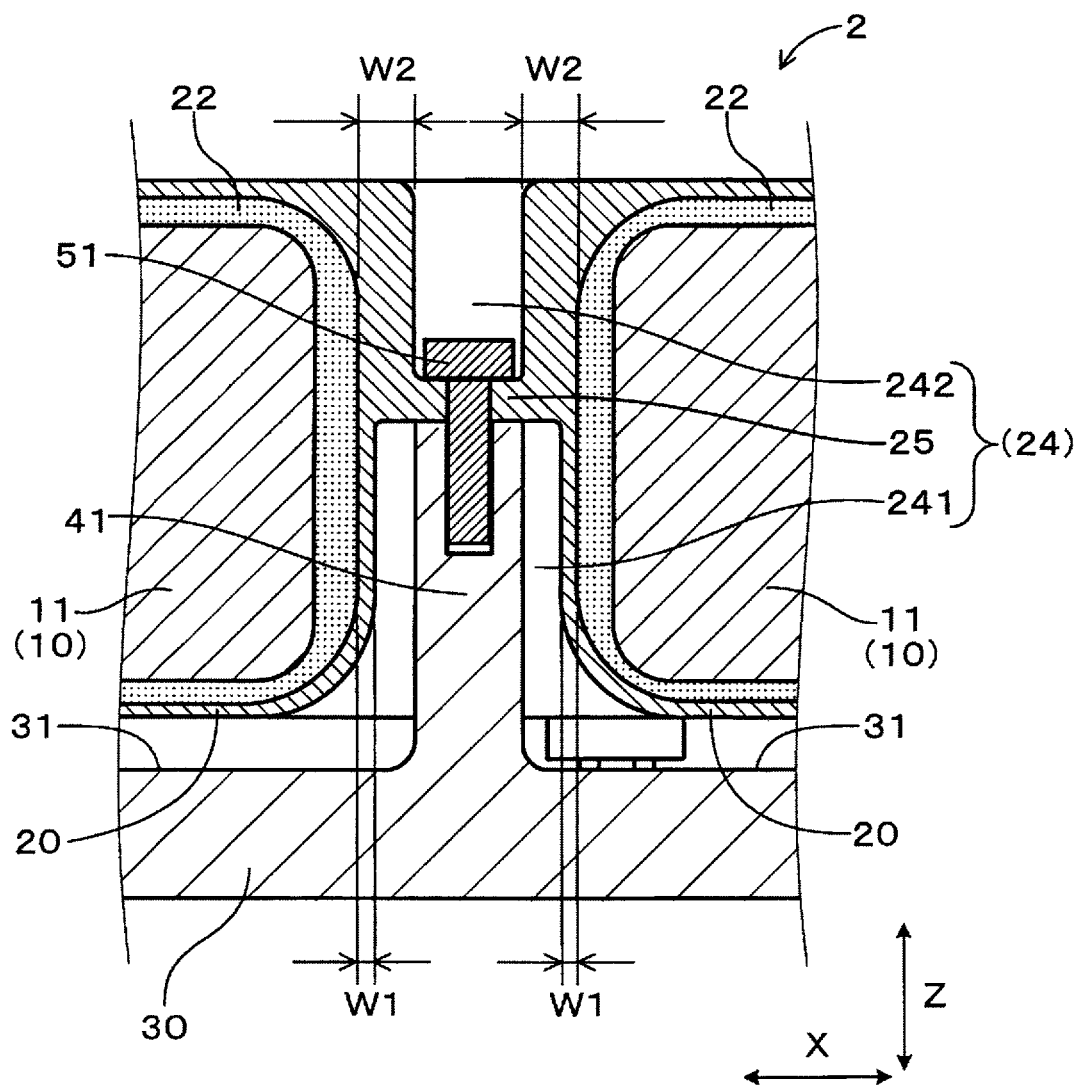
FIG. 6 is an enlarged cross-sectional view taken along line VI-VI of FIG. 5.

As illustrated in FIG. 6, the concaved recess 24 is elongated to extend in the height direction Z. The first catch member 25, which has a substantially plate shape, is provided in the concaved recess 24 to partition a space of the concaved recess 24 in the height direction Z, resulting in the concaved recess 24 having a fastening-member arrangement wall 241 and a bolt installation wall 242. That is, the fastening-member arrangement wall 241 and the bolt installation wall 242 are located to sandwich the first catch member 25.

The fastening-member arrangement wall 241 is shaped to define an arrangement space in which the first fastening member 41 is arranged, and the bolt installation wall 242 is shaped to define an installation space in which the bolt 51 is installed therein for fastening the first fastening member 41 to the first catch member 25.

In particular, as illustrated in FIG. 6, the bolt installation wall 242 has a thickness W2, and the fastening-member arrangement wall 241 has a thickness W1, the wall thickness W2 is larger than the wall thickness W1.

Figure 4:
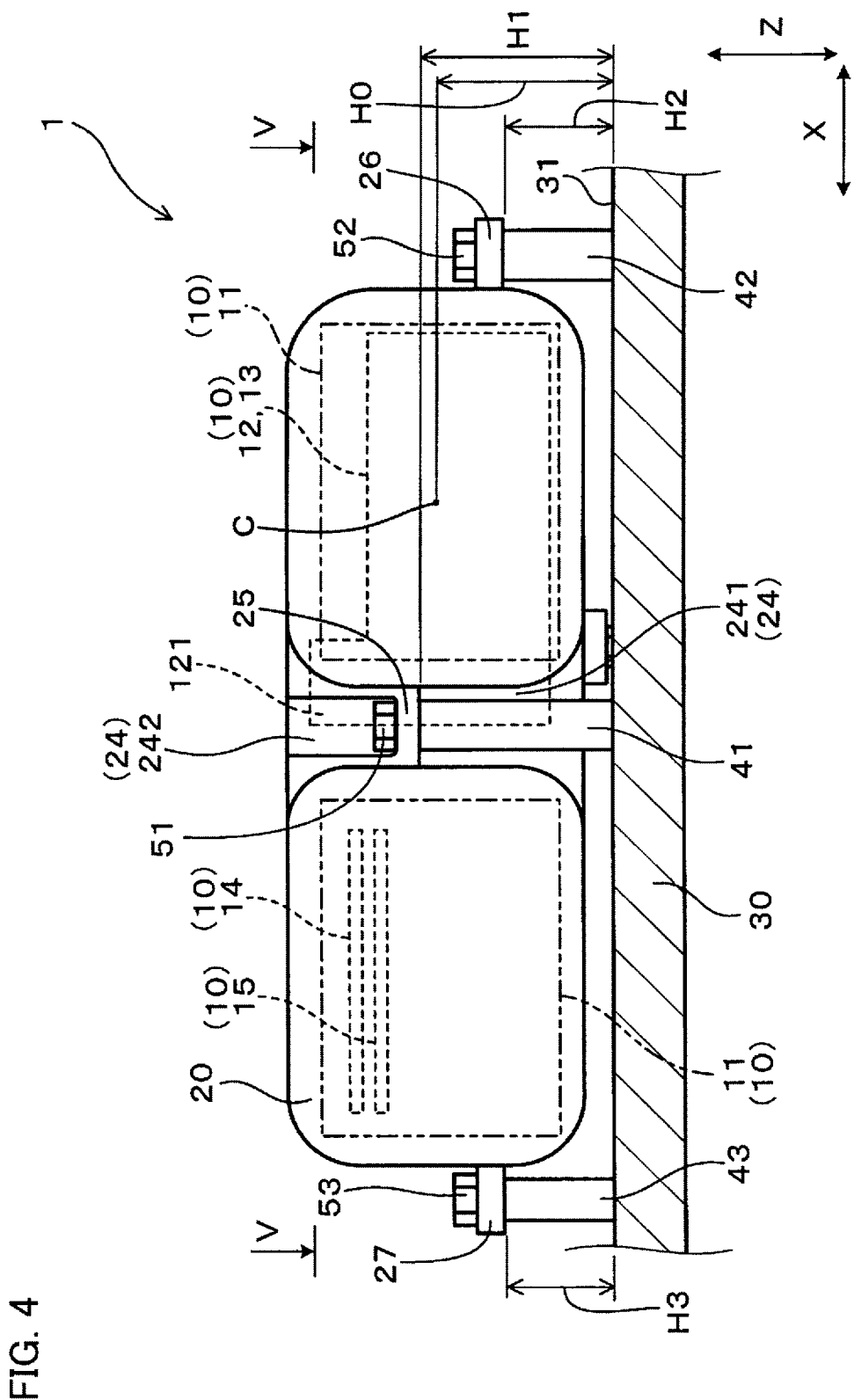
FIG. 4 is a cross-sectional view taken along line INT-INT of FIG. 1.

Referring to FIG. 4, the fastening members 40 also include a third fastening member 43 mounted vertically on the inner bottom surface 31 of the converter case 30.

The capacitor case 20 has left and right ends in its longitudinal direction thereof, and includes a second catch member 26 and a third catch member 27 attached to respective right and left ends thereof. Each of the second and third catch members 26 and 27 is shaped to have a rib, and has a through hole formed therethrough. The second catch member 26 is fastened to the second fastening member 42 with a bolt 52 fitted through the corresponding through hole, and the third catch member 27 is fastened to the third fastening member 43 with a bolt 53 fitted through the corresponding through hole.

As described above, the first to third fastening members 41 to 43 are vertically mounted on the inner bottom surface 31 of the converter case 30, which are shown in FIG. 4. The first to third fastening members 41, 42, and 43 have respective heights H1, H2, and H3 in the height direction Z. The height H1 of the first fastening member 41 is the highest, so that the heights H2 and H3 of the second and third fastening members 42 and 43 are shorter than the height H1 of the first fastening member 41. The height H2 of the second fastening member 42 according to the present embodiment is set to be equal to the height H3 of the third fastening member 43.

The capacitor module 2 has a middle position C in the Z direction, and the middle position C of the capacitor module 2 in the Z direction has a height H0, and the height H1 of the first fastening member 41 is set to be higher than the height H0 of the middle position C of the capacitor module 2 in the Z direction. In addition, the heights H2 and H3 of the second and third fastening members 42 and 43 are each set to be shorter than the height H0 of the middle position C of the capacitor module 2.

Each of the heights H1, H2, and H3 can be set to be a value selected from a predetermined range of 30 mm to 50 mm inclusive.

The converter case 30 according to the present embodiment is made of metal, but can be made of resin.

Referring to FIG. 6, the first fastening member 41 of the present embodiment, which is made of metal, is integrally formed with the converter case 30 to have a solid single-piece construction except for the through hole through which the bolt 51 is fitted. Although illustration is omitted, each of the second and third fastening members 42 and 43 of the present embodiment, which is made of metal, is integrally formed with the converter case 30 to have a solid single-piece construction except for the corresponding through hole through which a corresponding one of the bolts 52 and 53 is fitted.

Additionally, as illustrated in FIG. 4, the discharge circuit board 13 with the discharge resistor 12 has an end closer to the first fastening member 41. The closer end of the discharge circuit board 13 is configured to extend to be closer to the first fastening member 41 than the capacitors 11 are when viewed in a predetermined view direction, so that the closer end of the discharge circuit board 13 serves as an extension portion 121; the predetermined view direction is defined to be perpendicular to the alignment direction of the first and second fastening members 141 and 142 and be parallel to the inner bottom surface 31 of the converter case 30. For example, the extension portion 121 of the discharge circuit board 13 is located to be overlapped with the first fastening member 41 when viewed in the predetermined view direction.

The extension portion 121 is also shaped to project outwardly in the height direction Z.

The first fastening member 41 is located to be closest to the discharge resistor 12 and the discharge circuit 13 included in the electronic components 10 in all the fastening members 40.

Referring to FIG. 1, to the first side face 21 of the capacitor module 2, the P busbar 14 and the N busbar 15 are mounted.

Each of the P and N busbars 14 and 15 has opposing first and second ends. The first end of the P busbar 14 is disposed in the sealing resin 22 to be connected to an unillustrated positive electrode of each capacitor 11. Similarly, the first end of the N busbar 15 is disposed in the sealing resin 22 to be connected to an unillustrated negative electrode of each capacitor 11. This connection configuration of the two capacitors 11 and the P and N busbars 14 and 15 enables the P and N busbars 14 and 15 to parallelly connect the two capacitors 11 to each other.

In other words, the second end of the P busbar 14 and the second end of the N busbar 15 are protruded from the first side face 21 constituted by the sealing resin 22 to face each other in the height direction Z.

The power converter 1 includes a plurality of connection terminals 141, each of which has opposing first and second ends. The first ends of the connection terminals 141 are connected to the second end of the P busbar 14, and the second ends of the connection terminals 141 are connected to corresponding input terminals of the semiconductor module 10. Similarly, the first ends of the connection terminals 151 are connected to the second end of the N busbar 15, and the second ends of the connection terminals 151 are connected to corresponding input terminals of the semiconductor module 10.

The semiconductor module 16 has output terminals. The power converter 1 also includes output busbars 171. The output terminals of the semiconductor module 16 are connected to the terminal holder 17 via the respective output busbars 171.

Next, the following describes how the power converter 1 of the present embodiment works to thereby achieve benefits.

The power converter 1 of the present embodiment includes at least one of the electronic components 10 arranged between the first and second fastening members 41 and 42 for fastening the capacitor module 2 to the converter case 30. This arrangement enables heat generated from the at least one of the electronic components 10 to be more easily transferred to the converter case 30 through the first and second fastening members 41 and 42, making it possible to improve the heat dissipation of the capacitor module 2 and power converter 1.

In addition, the first fastening member 41, which is located closest to the discharge resistor 12 and discharge circuit board 13 of the electronic members 40 mounted to the capacitor module 2, has the greatest height H1 in all the fastening members 40. This enables head generated from the discharge resistor 12 and discharge circuit 13 mounted to the capacitor module 2 to be positively dissipated outwardly through the first fastening member 41, making it possible to further improve the heat dissipation of the capacitor module 2 and power converter 1.

Note that another of the fastening members 40 in place of the first fastening member 41 can be located closest to the at least one of the electronic members 40, which is mounted to the capacitor module 2, and can have the greatest height in all the fastening members 40. This modification achieves the above same benefits.

The capacitors 11 of the present embodiment are incorporated in the capacitor case 20, and the capacitor case 20 has the first side face 23 that defines an opening, resulting in the first side face 23 serving as the opening first face 23. The capacitor case 20 also has the second face opposite to the first face 23, and has the concaved recess 24 formed in the second face.

In the concaved recess 24, the fastening-member arrangement wall 241, the first catch member 25 to be fastened to the first fastening member 241, and the bolt installation wall 242 are provided while the fastening-member arrangement wall 241 and the bolt installation wall 242 sandwich the first catch member 25. The first fastening member 41 is arranged in the fastening-member arrangement wall 241, and the bolt 51 is arranged in the bolt installation wall 242.

The first fastening member 241 arranged in the concaved recess 24 results in the discharge resistor 12 and/or the discharge circuit board 13, which serve as heating elements, being closer to the first fastening member 41, making it still further improve the heat dissipation of the capacitor module 2 and power converter 1.

Additionally, in the concaved recess 24 of the first embodiment, the thickness W2 of the bolt installation wall 242 is larger than the thickness W1 of the fastening-member arrangement wall 241. This enables the volume of the capacitor case 20 to be maintained as large as possible while providing the concaved recess 24. This improves heat transfer from at least one of the electronic components 10, which serves as a heating element, to the first catch member 25, making it possible for the capacitor module 2 and power converter 1 to have higher heat dissipation ability.

The discharge circuit board 13 with the discharge resistor 12, which is at least one of the electronic components 10 mounted to the capacitor module 2, has the extension portion 121 configured to extend to be closer to the first fastening member 41 than the capacitors 11 are when viewed in the predetermined view direction that is defined to be perpendicular to the alignment direction of the first and second fastening members 141 and 142 and be parallel to the inner bottom surface 31 of the converter case 30. This enables heat generated from the discharge resistor 12 to be more easily dissipated through the extension portion 121, making it possible to moreover improve the heat dissipation of the capacitor module 2 and power converter 1.

The extension portion 121 of the present embodiment is shaped to project in the height direction Z of each of the first to third fastening members 41 to 43, making it possible for the capacitor module 2 and power converter 1 to have further heat dissipation ability.

The discharge circuit board 13 with the discharge resistor 12 is selected from the electronic components 10 to be mounted to the capacitor module 2. This encourages dissipation of heat from the discharge circuit board 13 and the discharge resistor 12, each of which has a relatively larger amount of heat generated therefrom in the electronic components 10, making it possible to additionally improve the heat dissipation of the capacitor module 2 and power converter 1.

As described above, the present embodiment provides the capacitor module 2 and power converter 1 with more improved heat dissipation.

Figure 7:
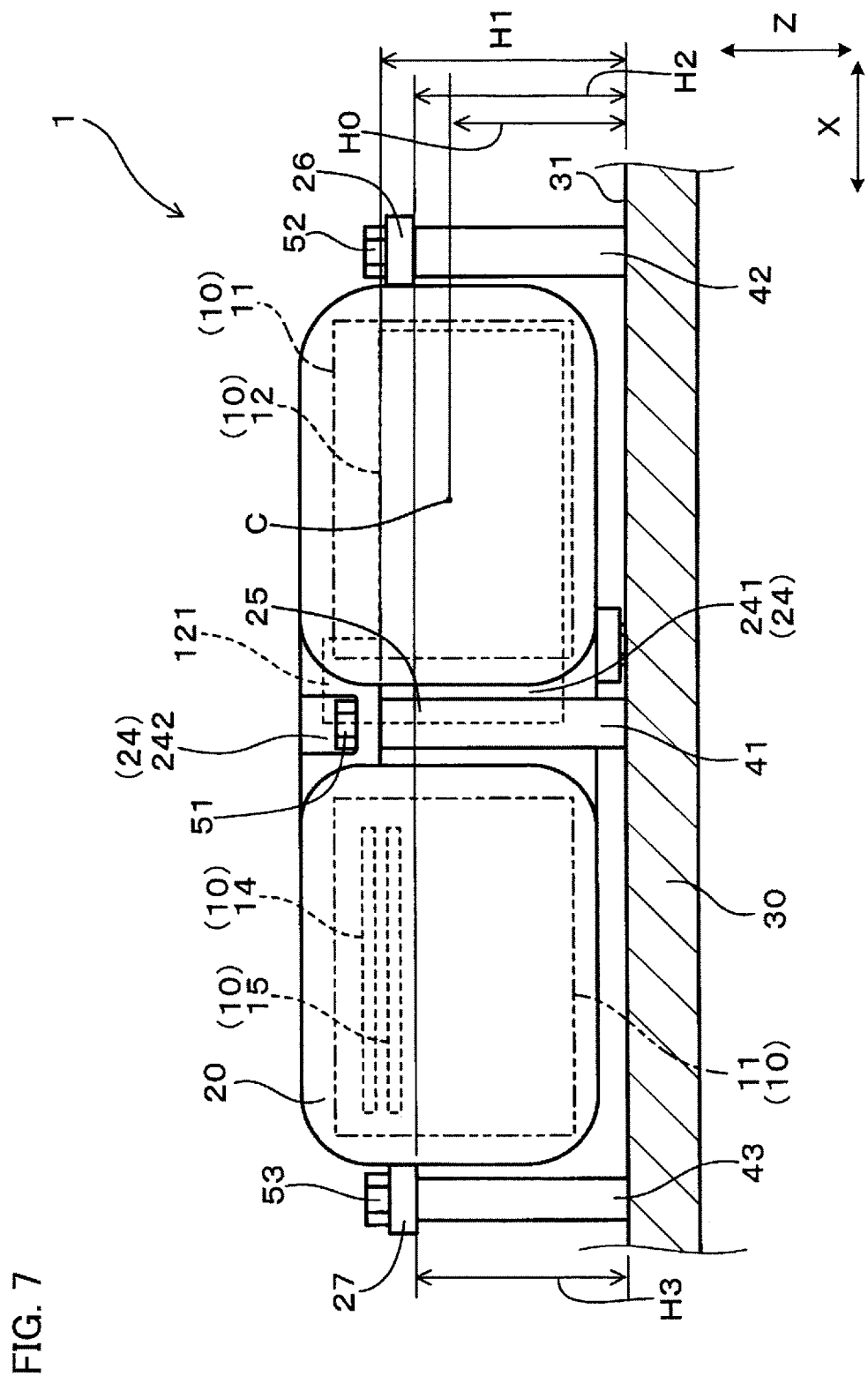
FIG. 7 is a partially enlarged cross-sectional view taken along line INT-INT of FIG. 1 according to a first modification.

Referring to FIG. 4, the height H1 of the first fastening member 41 is set to be higher than the height H0 of the middle position C of the capacitor module 2 in the Z direction, and the heights H2 and H3 of the second and third fastening members 42 and 43 are each set to be shorter than the height H0 of the middle position C of the capacitor module 2. The present disclosure is however not limited thereto. Specifically, as a first modification illustrated in FIG. 7, all the heights H1 to H3 can be set to be higher than the height H0 of the middle position C of the capacitor module 2 in the Z direction.

Figure 8:
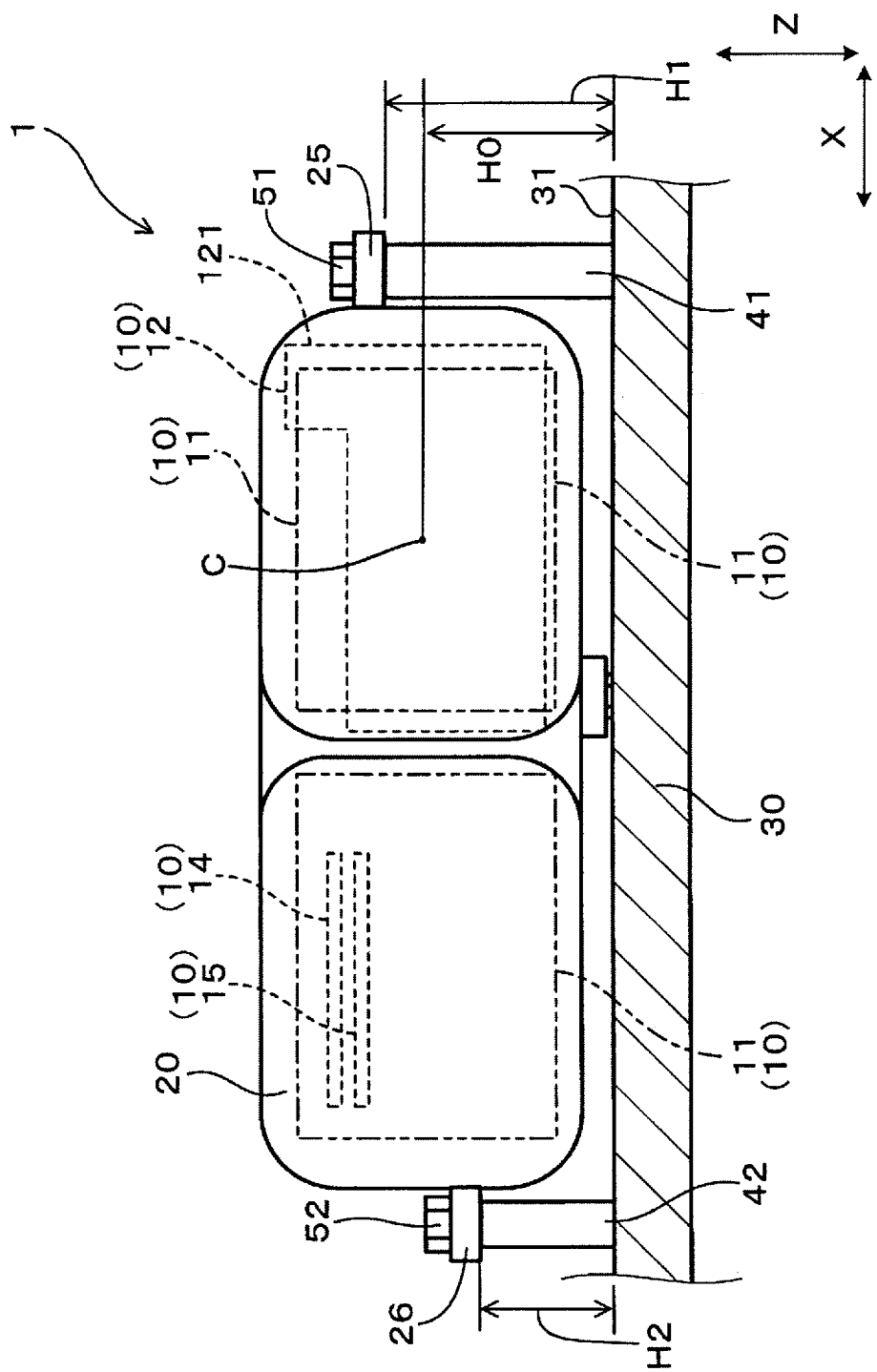
FIG. 8 is a partially enlarged cross-sectional view taken along line INT-INT of FIG. 1 according to a second modification.

As a second modification illustrated in FIG. 8, the capacitor module 2 has opposing first and second ends in the X direction, and the first catch member 25 fastened to the first fastening member 41 can be mounted to the first end of the capacitor module 2, and the second catch member 26 fastened to the second fastening member 42 can be mounted to the second end of the capacitor module 2.

To components in each of the first and second modifications, which are similar to those in the present embodiment, like reference characters are assigned, and therefore descriptions of the components in each of the first and second modifications are omitted or simplified to avoid redundant description.

Each of the first and second modifications substantially achieve the same benefits as those described in the first embodiment.

Figure 2:
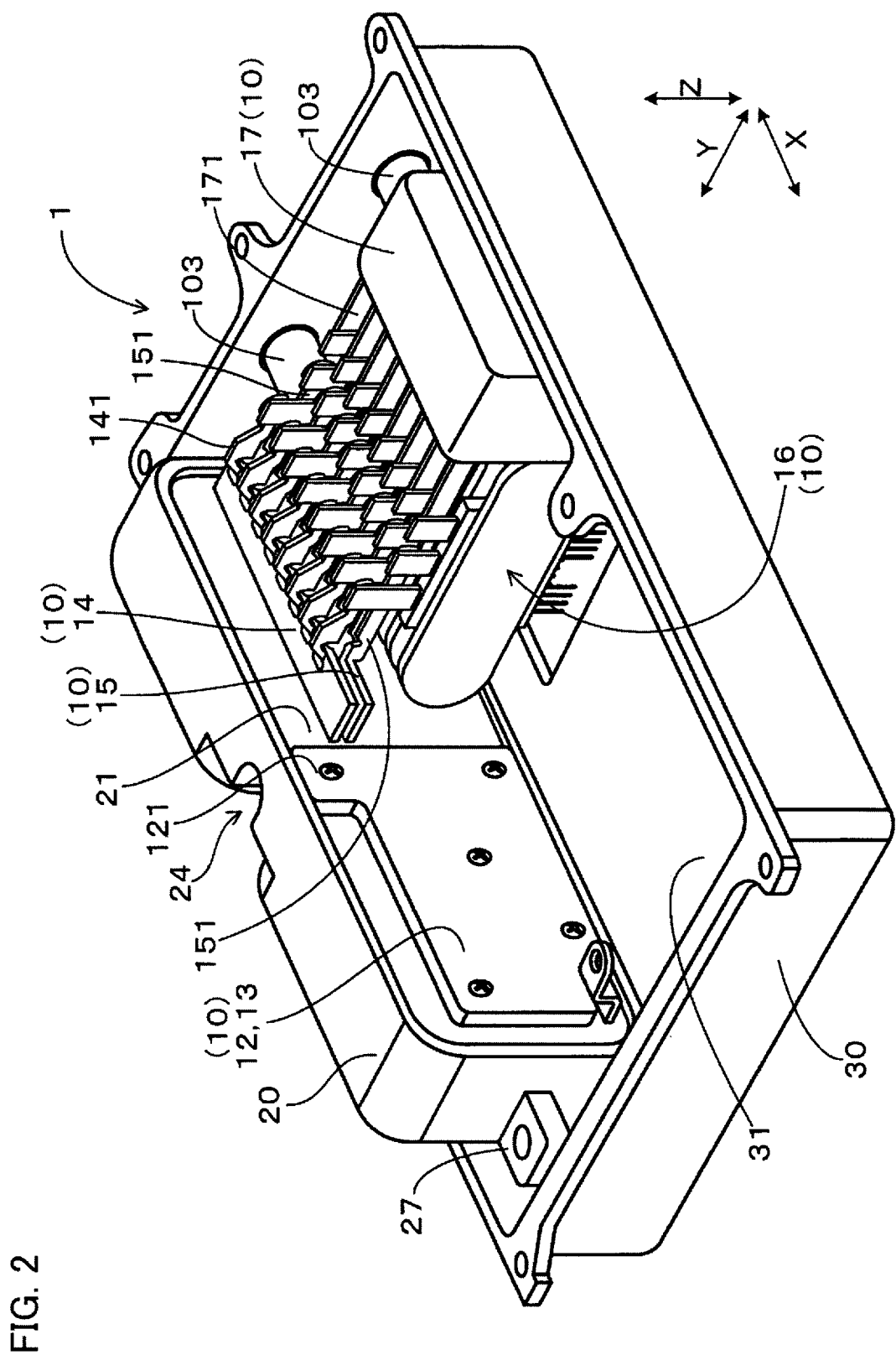
FIG. 2 is a schematic perspective view of the power converter illustrated in FIG. 1.
Figure 3:
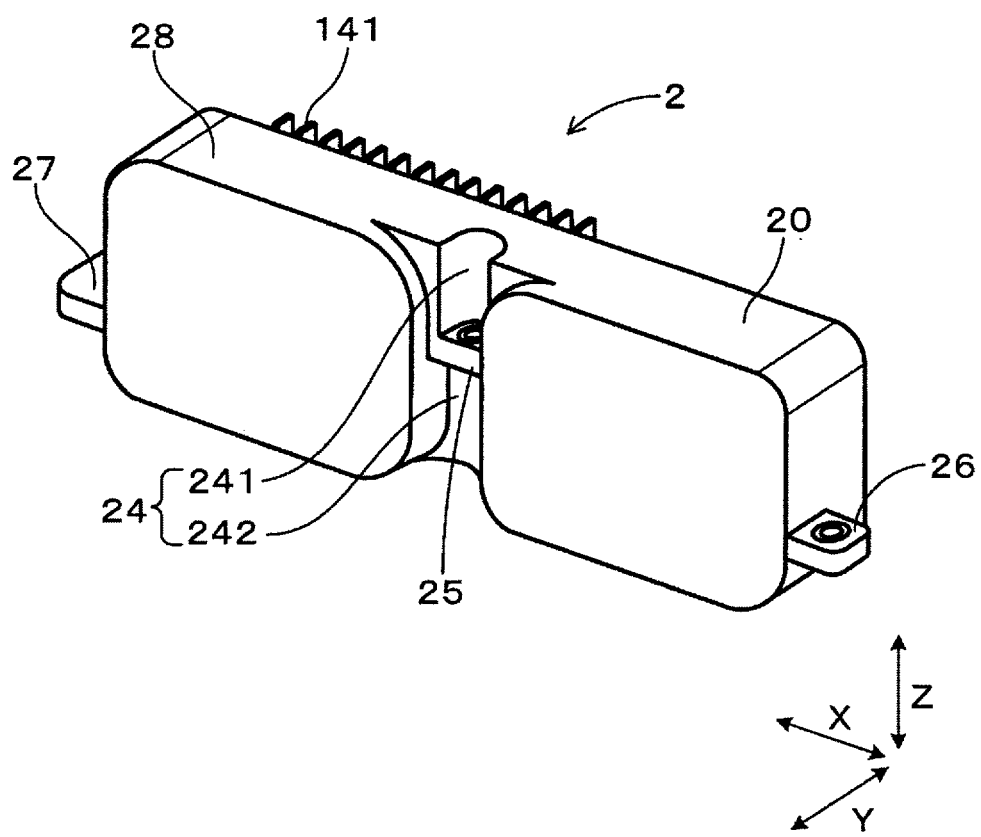
FIG. 3 is a schematic perspective view of a capacitor module illustrated in FIG. 1.

As illustrated in FIG. 2, the discharge resistor 12, the discharge circuit board 13, the P busbar 14, and the N busbar 15, which are selected from the electronic components 10 except for the capacitors 11, are mounted to the first side face 21 of the capacitor module 21; the first side face 21 serves as a potting surface of the capacitor module 21. The present disclosure is however not limited thereto.

Specifically, one or more electronic components except for the capacitors 11 can be mounted to another side face of the capacitor module 2 except for the first side face 21.

Figure 9:
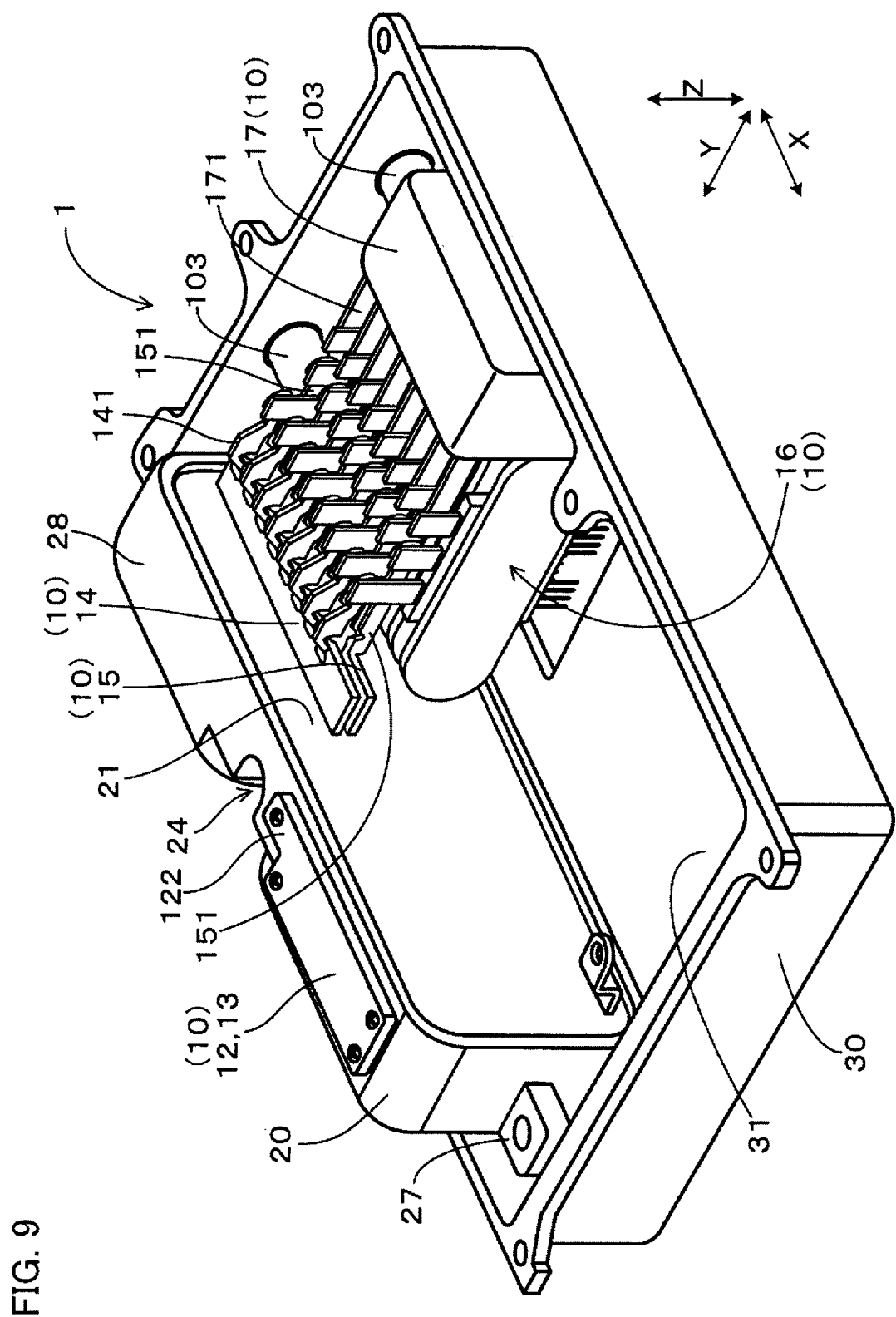
FIG. 9 is a schematic perspective view of a power converter according to a third modification.
Figure 10:
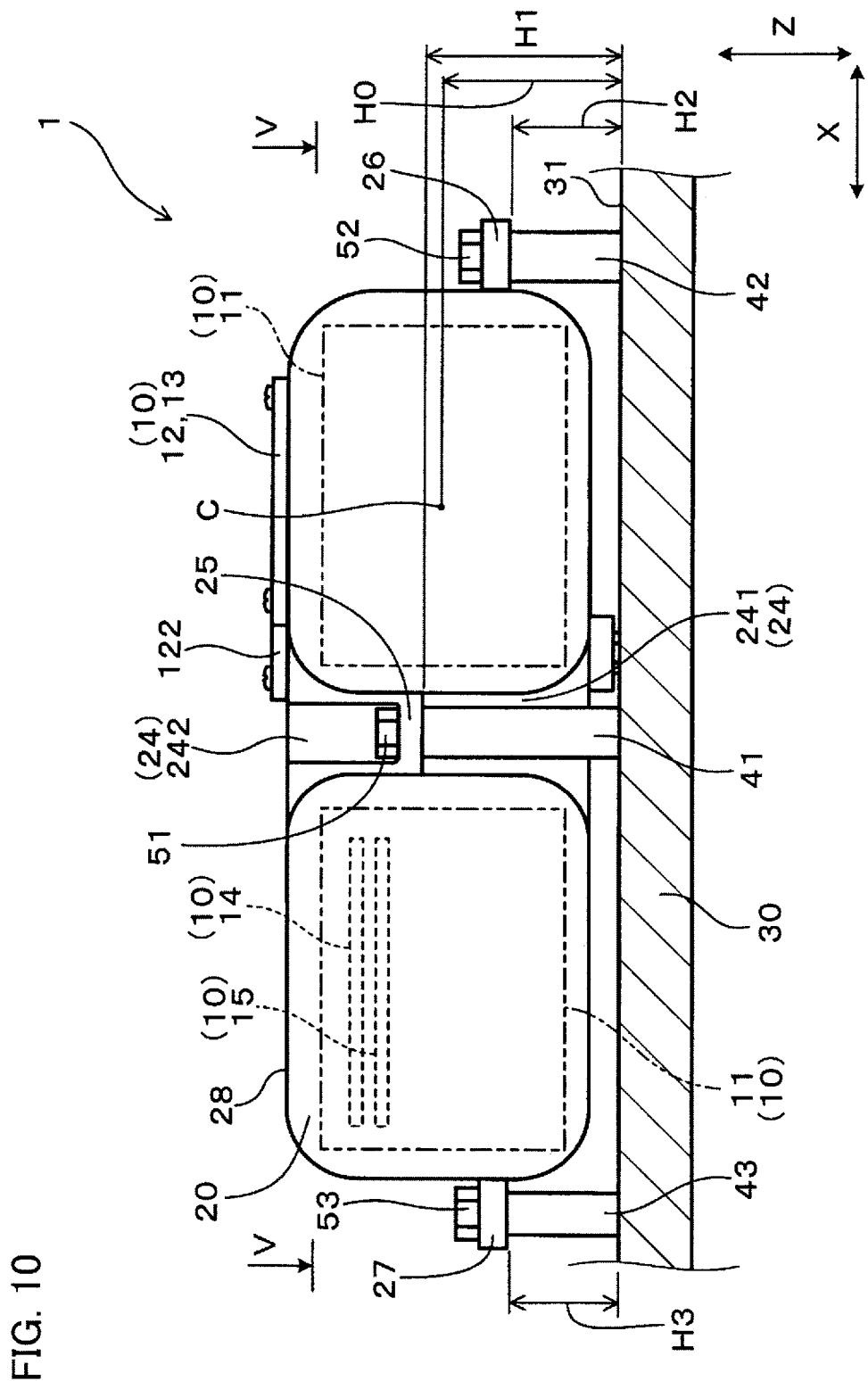
FIG. 10 is a partially enlarged cross-sectional view taken along line INT-INT of FIG. 1 according to the third modification.

For example, as a third modification illustrated in FIGS. 9 and 10, the capacitor module 2 may have a top face 28 in the height direction Z, and the discharge resistor 12 and the discharge circuit board 13, which are included in the electronic components 10 except for the capacitors 11, can be mounted to the top face 28 of the capacitor module 2.

In particular, the discharge circuit board 13 with the discharge resistor 12 has an end closer to the first fastening member 41, which serves as an extension portion 122.

To components in the third modification, which are similar to those in the present embodiment, like reference characters are assigned, and therefore descriptions of the components in the third modification are omitted or simplified to avoid redundant description.

As illustrated in FIG. 10, the discharge resistor 12 and the discharge circuit board 13 are arranged between the first and second fastening members 41 and 42 when viewed in the view direction perpendicular to the alignment direction of the first and second fastening members 41 and 42; the view direction is parallel to the inner bottom surface 31 of the converter case 30. This therefore enables the third embodiment to achieve substantially the same benefits as those described in the present embodiment.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
   a plurality of electronic components constituting a power conversion circuit;
   a capacitor module including a capacitor, the capacitor constituting the power conversion circuit;
   a converter case having an inner bottom surface and housing the electronic components and the capacitor module; and
   a plurality of fastening members that include a first fastening member and a second fastening member and that are configured to fasten the capacitor module to the converter case, the first and second fastening members being mounted on the inner bottom surface of the converter case,
   at least one of the electronic components being mounted to the capacitor module and being arranged between the first fastening member and the second fastening member when viewed in a view direction perpendicular to an alignment direction of the first and second fastening members, the view direction being parallel to the inner bottom surface of the converter case,
   the at least one of the electronic components mounted to the capacitor module having an extension portion configured to extend to be closer to at least one of the fastening members than the capacitor is when viewed in the view direction,
   the extension portion being shaped to project in a height direction of the fastening members.

2. The power converter according to claim 1, wherein:
one of the fastening members is located closest to the at least one of the electronic components mounted to the capacitor module in all the fastening members; and
the one of the fastening members has a greatest height from the inner bottom surface of the converter case in all the fastening members.

3. The power converter according to claim 1, wherein:
the capacitor is incorporated in a capacitor case; and
the capacitor case has a first face that defines an opening, and a second face opposite to the first face, the second face having a concaved recess formed therein, the capacitor case further comprising:
a fastening-member arrangement wall in which the first fastening member is arranged;
a first catch member fastened to the first fastening member; and
a bolt installation wall in which a fastening bolt is installed,
the fastening-member arrangement wall, the first catch member, and the bolt installation wall being provided in the concaved recess with the fastening-member arrangement wall and the bolt installation wall sandwiching the first catch member.

4. The power converter according to claim 3, wherein:
each of the fastening-member arrangement wall and the bolt installation wall has a thickness, and the thickness of the bolt installation wall is larger than the thickness of the fastening-member arrangement wall.

5. The power converter according to claim 1, wherein:
the at least one of the electronic components mounted to the capacitor module serves as at least one of a discharge resistor and a discharge circuit.

6. A power converter comprising:
a plurality of electronic components constituting a power conversion circuit;
a capacitor module including a capacitor, the capacitor constituting the power conversion circuit;
a converter case having an inner bottom surface and housing the electronic components and the capacitor module;
a plurality of fastening members that include a first fastening member and a second fastening member and that are configured to fasten the capacitor module to the converter case, the first and second fastening members being mounted on the inner bottom surface of the converter case; and
a catch member,
at least one of the electronic components being mounted to the capacitor module and being arranged between the first fastening member and the second fastening member when viewed in a view direction perpendicular to an alignment direction of the first and second fastening members, the view direction being parallel to the inner bottom surface of the converter case,
one of the fastening members being located closest to the at least one of the electronic components mounted to the capacitor module in all the fastening members,
the one of the fastening members having a greatest height from the inner bottom surface of the converter case in all the fastening members, and another of the fastening members having a height different from the greatest height of the one of the fastening members,
the capacitor being incorporated in a capacitor case,
the capacitor case having a first face that defines an opening, and a second face opposite to the first face, the second face having a concaved recess formed therein, and
the catch member being fastened to the one of the fastening members and being provided in the concaved recess.

7. The power converter according to claim 6, the capacitor case further comprising:
a fastening-member arrangement wall in which the first fastening member is arranged; and
a bolt installation wall in which a fastening bolt is installed,
the fastening-member arrangement wall, the catch member, and the bolt installation wall being provided in the concaved recess with the fastening-member arrangement wall and the bolt installation wall sandwiching the catch member.

8. The power converter according to claim 7, wherein:
each of the fastening-member arrangement wall and the bolt installation wall has a thickness, and the thickness of the bolt installation wall is larger than the thickness of the fastening-member arrangement wall.

9. A power converter comprising:
a plurality of electronic components constituting a power conversion circuit;
a capacitor module including a capacitor, the capacitor constituting the power conversion circuit;
a converter case having an inner bottom surface and housing the electronic components and the capacitor module; and
a plurality of fastening members that include a first fastening member and a second fastening member and that are configured to fasten the capacitor module to the converter case, the first and second fastening members being mounted on the inner bottom surface of the converter case,
at least one of the electronic components being mounted to the capacitor module and being arranged between the first fastening member and the second fastening member when viewed in a view direction perpendicular to an alignment direction of the first and second fastening members, the view direction being parallel to the inner bottom surface of the converter case,
one of the fastening members being located closest to the at least one of the electronic components mounted to the capacitor module in all the fastening members,
the one of the fastening members having a greatest height from the inner bottom surface of the converter case in all the fastening members, and another of the fastening members having a height different from the greatest height of the one of the fastening members, wherein:
the at least one of the electronic components mounted to the capacitor module has an extension portion configured to extend to be closer to at least one of the fastening members than the capacitor is when viewed in the view direction.

10. The power converter according to claim 9, wherein:
the extension portion is shaped to project in a height direction of the fastening members.

11. The power converter according to claim 6, wherein:
the at least one of the electronic components mounted to the capacitor module serves as at least one of a discharge resistor and a discharge circuit.

* * * * *